(12) United States Patent
Yamada

(10) Patent No.: US 6,661,159 B2
(45) Date of Patent: Dec. 9, 2003

(54) CONSTRUCTION FOR TRANSMITTING DISPLACEMENT OF PIEZOELECTRIC ELEMENT

(75) Inventor: Yutaka Yamada, Suzuka (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/196,276

(22) Filed: Jul. 17, 2002

(65) Prior Publication Data

US 2003/0015939 A1 Jan. 23, 2003

(30) Foreign Application Priority Data

Jul. 18, 2001 (JP) ........................................ 2001-217756
May 30, 2002 (JP) ........................................ 2002-157652

(51) Int. Cl.[7] ........................................... H01L 41/083
(52) U.S. Cl. ................................. 310/328; 310/323.13
(58) Field of Search ........................... 310/323.13, 328, 310/329

(56) References Cited

U.S. PATENT DOCUMENTS

| | | | | |
|---|---|---|---|---|
| 4,333,434 A | * | 6/1982 | Brunais et al. ............. | 123/478 |
| 4,769,569 A | * | 9/1988 | Stahlhuth .................... | 310/328 |
| 5,455,477 A | * | 10/1995 | Sano et al. .................. | 310/328 |
| 5,479,064 A | * | 12/1995 | Sano ........................... | 310/328 |
| 6,234,404 B1 | * | 5/2001 | Cooke .......................... | 239/88 |
| 6,251,658 B1 | * | 6/2001 | Henderson et al. ...... | 435/285.1 |
| 6,326,717 B1 | * | 12/2001 | Mattes ........................ | 310/328 |
| 6,333,586 B1 | * | 12/2001 | Polach et al. ............... | 310/328 |
| 6,359,373 B1 | * | 3/2002 | Buckley et al. ............. | 310/328 |
| 6,483,227 B2 | * | 11/2002 | Murai et al. ................ | 310/328 |

FOREIGN PATENT DOCUMENTS

| | | | | |
|---|---|---|---|---|
| JP | 8-275563 | 10/1996 | ............ | H02N/2/00 |
| JP | 11-108227 | 4/1999 | ............ | F16K/31/02 |

* cited by examiner

Primary Examiner—Thomas M. Dougherty
(74) Attorney, Agent, or Firm—Nixon & Vanderhye P.C.

(57) ABSTRACT

Structure for transmitting displacement of a piezoelectric element includes a piston member. A distal-end plate portion has a receiving face adapted to be brought into direct contact with a distal-end face of the piston member. The distal-end face of the piston member is brought into direct contact with a mating member at a displacement transmitting face which is situated on an opposite side to the receiving face. End faces of a piezoelectric element in a displacement direction are maintained substantially in parallel to each other while the piezoelectric element is being driven. The contact configuration between the distal-end face and the receiving face is an annular and linear contact condition, whereby the piezoelectric element, the piston member and the distal-end plate portion are constructed so as to remain substantially stationary while the piezoelectric element is being driven.

7 Claims, 9 Drawing Sheets

CONSTRUCTION FOR TRANSMITTING DISPLACEMENT OF PIEZOELECTRIC ELEMENT

BACKGROUND OF THE INVENTION

1. Field of the Invention

The present invention relates to a construction for transmitting the displacement of a piezoelectric element to a mating member.

2. Description of the Related Art

A stacked piezoelectric element, which is constituted by ceramic piezoelectric plates which are stacked in a direction in which the piezoelectric plates are displaced when voltage is applied thereto via internal electrodes, is known. The piezoelectric plates are displaced when voltage is applied to respective piezoelectric plates via the associated internal electrodes, and the sum of the respective displacements becomes the overall displacement of the stacked piezoelectric element.

In employing the displacement of the stacked piezoelectric element, the displacement thereof is transmitted, to a mating member which requires it, via a displacement transmission construction.

The displacement transmission construction is required to have a performance for transmitting the displacement of the piezoelectric element to the mating member without any loss.

In order to minimize the loss of displacement to be transmitted, there may be a case where between the displacement transmitting construction and the mating member to which the displacement of the piezoelectric element is transmitted by the construction contact surfaces of both the displacement transmitting construction side and the mating member side, are formed flat. Since transmission of a displacement between flat surfaces reduces Hertz stress, a loss in transmitting the displacement can be minimized.

However, it is extremely difficult to machine either of the displacement transmitting construction and the mating member such that their contact surfaces become a smooth plane. Since there exist a number of minute irregularities on the contact surfaces, in many cases the contact condition between the displacement transmitting construction and the mating member does not become a plane contact but becomes a partial contact.

In addition, since the stacked piezoelectric element is made of ceramic and is therefore fragile, it is desired that end faces of the stacked piezoelectric element in the displacement direction are in parallel with each other. In the event that the both end faces are not in parallel with each other, loads applied to the stacked piezoelectric element from the end faces become unbalanced, or unbalanced loads are exerted on the stacked piezoelectric element, and therefore, there may be a risk that the piezoelectric plates fracture or are damaged.

Additionally, a displacement transmitting construction such as disclosed in Japanese Unexamined Patent Publication No. 8-275563 is known.

This displacement transmitting construction has a conical concave surface as a contact surface, and there is provided a member between the displacement transmitting construction and the mating member which has a hemispherical convex surface for receiving the concave surface.

When an unbalanced load is exerted on the displacement transmitting construction due to a bending force relative to a direction which is in parallel with the displacement direction of the piezoelectric element, the hemispherical convex surface rotates appropriately to prevent the transmission of the unbalanced load to the piezoelectric element side. Thus, the displacement transmitting construction is characterized in that the piezoelectric element is prevented from being fractured or damaged. However, as the displacement of the piezoelectric element is absorbed by the rotation or the collapse of the contact surface, or the displacement of the piezoelectric element is absorbed by a slight deformation in the plane contact surface of the member which has the hemispherical convex surface, this displacement transmitting construction is not desirable.

In addition, even in the event that the displacement transmitting construction, and a member which is brought into a direct contact therewith, are brought into contact with each other both at the convex surfaces, it is difficult to prevent the occurrence of the aforesaid slight deformation. Additionally, there may be a risk that the protruding end of the convex surface collapses due to the displacement of the piezoelectric element, the dead weight of the piezoelectric element itself, or loads applied to the piezoelectric element, to thereby absorb the displacement of the piezoelectric element, causing a loss in transmitting the displacement.

SUMMARY OF THE INVENTION

The present invention was made in view of the above situations, and an object thereof is to provide a construction for transmitting the displacement of a piezoelectric element which can be disposed between a stacked piezoelectric element and a mating member to which a displacement is transmitted without any extra member being interposed therebetween, which can minimize a loss associated with the transmission of a displacement and which can make it difficult to apply an unbalanced load to the stacked piezoelectric element.

With a view to attaining the object, according to the invention, there is provided a construction for transmitting the displacement of a piezoelectric element which is constructed in such a manner as to transmit, to a mating member, a displacement generated in a stacked piezoelectric element when the stacked piezoelectric element is energized to be driven and which comprises a piston member which is in direct contact with the piezoelectric element and is disposed at one end face of the piezoelectric element in a displacement direction thereof and a distal-end plate portion which has a receiving face adapted to be brought into direct contact with a distal-end face of the piston member in the displacement direction of the piezoelectric element and which is adapted to be brought into direct contact with a mating member at a displacement transmitting face thereof which is situated on an opposite side to the receiving face, the construction for transmitting the displacement of a piezoelectric element being characterized in that both end faces of the piezoelectric element in the displacement direction thereof are maintained substantially in parallel with each other, in that a contact configuration between the distal-end face of the piston member and the receiving face of the distal-end plate portion is in annual and linear conditions, and in that the piezoelectric element, the piston member and the distal-end plate portion are constructed to be substantially stationary relative to directions except for the displacement direction of the piezoelectric element at least while the piezoelectric element is being driven.

In the invention, the piezoelectric element is brought into direct contact with the displacement transmitting construction, which is, in turn, brought into direct contact with the mating member. Consequently, it is possible to reduce Hertz stress generated at a contact portion where different members are brought into contact with each other and a loss which occurs when a displacement is absorbed by a deformation of the respective members.

In addition, since the end faces of the piezoelectric element in the displacement direction thereof is maintained substantially in parallel with each other, it is difficult to exert an unbalanced stress and, therefore, it is difficult for stress to be concentrated on a specific portion of the piezoelectric element. Thus, the piezoelectric element can be prevented from being damaged.

Additionally, as the contact configuration between the distal-end face of the piston member and the receiving face of the distal-end plate portion is in annular and linear contact conditions, when compared with a case where curved surfaces are brought into point contact with each other, the displacement transmitting construction and the distal-end plate portion are allowed to be in contact with each other in a stable condition, and since they contact with each other linearly, the displacement transmitting construction and the distal-end plate portion deform less than when they are in point contact with each other, thereby making it possible to transmit the displacement of the piezoelectric element to the mating member with a limited loss.

Thus, according to the invention, it is possible to provide a construction, for transmitting the displacement of a piezoelectric element, which can be disposed between a stacked piezoelectric element and a mating member to which a displacement is transmitted without any extra member being interposed therebetween, which can minimize a loss associated with the transmission of a displacement and which can make difficult the application of an unbalanced load to the stacked piezoelectric element.

The present invention may be more fully understood from the description of preferred embodiments of the invention, as set forth below, together with the accompanying drawings.

DESCRIPTION OF THE PREFERRED EMBODIMENTS

Figure 1:
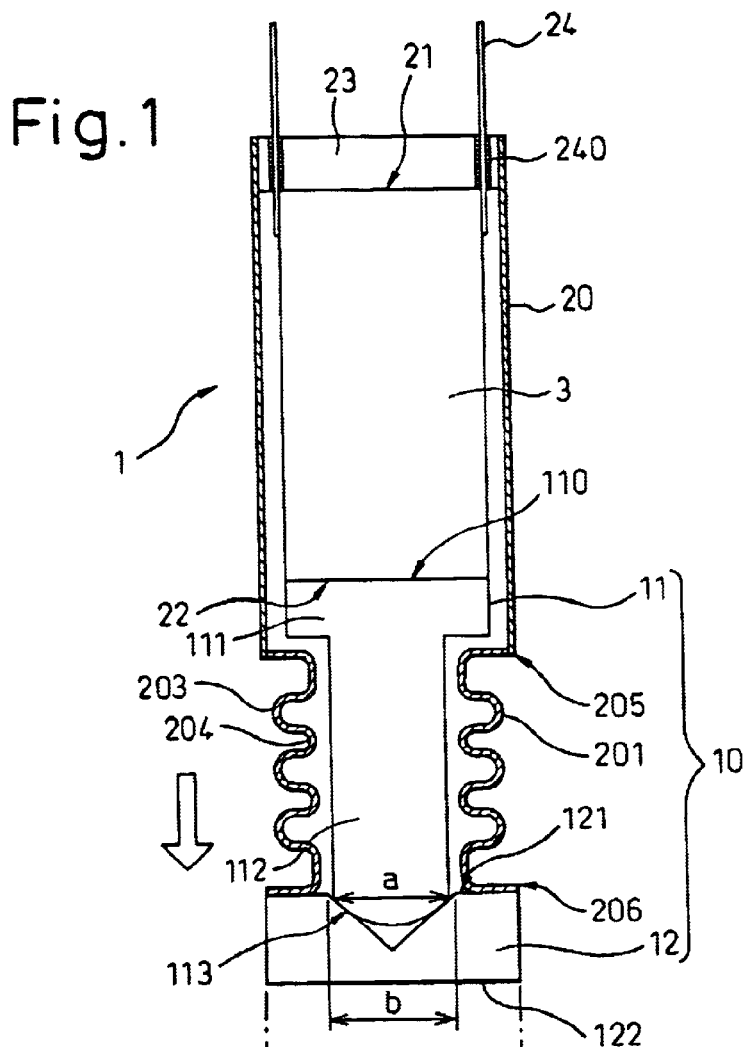
FIG. 1 shows a sectional view and a plan view showing a piezoelectric element and a displacement transmitting construction according to a first embodiment of the invention.

Referring to the drawings, embodiments of the invention will be described below.

First Embodiment

As shown in FIG. 1, a displacement transmitting construction 10 according to a first embodiment of the invention is constructed to transmit, to a mating member, a displacement of a stacked piezoelectric element 3 which is generated when the piezoelectric element 3 is energized to be driven and comprises a piston member 11 which is in direct contact with the piezoelectric element 3, is disposed at a proximal-end face 22 of the piezoelectric element 3 in a displacement direction thereof and has a contact surface 110 and a distal-end plate portion 12 having a receiving face 121 adapted to be brought into direct contact with a distal-end face 113 of the piston member 11 in the displacement direction of the piezoelectric element 3 and adapted to be brought into direct contact with the mating member at a displacement transmitting face 122 which is situated on an opposite side to the receiving face 121.

End faces 21, 22 of the piezoelectric element 3 in the displacement direction thereof are maintained in parallel with each other, and a contact configuration between the distal-end face 113 of the piston member 11 and the receiving face 121 of the distal-end plate portion 12 is in annular and linear contact conditions. The piezoelectric element 3, the piston member 11 and the distal-end plate portion 12 are constructed so as to be stationary relative to all directions except for the displacement direction of the piezoelectric element at least while the piezoelectric element 3 is being driven.

The construction will be described in detail below.

Shown in FIG. 1 is a piezoelectric actuator 1 constituted by the piezoelectric element 3 comprising the displacement transmitting construction 10 according to the first embodiment of the invention.

The displacement of the piezoelectric element 3 which is accommodated in a sealed state produced by an upper plate 23, a case main body 20, an expandable portion 201 and the distal-end plate portion 12 of the piezoelectric actuator 1 is transmitted via the displacement transmitting construction 10 comprising the piston member 11 and the distal-end plate portion 12, so that the piezoelectric element 3 is used as a driving source for an injector.

As shown in FIGS. 2 and 3A to 3C, the piezoelectric element 3 is constituted by piezoelectric layers 321 with internal electrode layers 323, 324 being interposed between the piezoelectric layers 321 in such a manner that a positive pole alternates with a negative pole. Internal electrode layers 323, 324 are partial poles of the piezoelectric layers 321, and the piezoelectric layers 321 have portions 119 in which the poles are not formed (see FIGS. 3A to 3C). As shown in the same figures, the internal electrodes 323 are disposed in such a manner as to be exposed to one side 301 whereas the internal electrodes 324 are disposed in such a manner as to be exposed to the other side 302 of the piezoelectric element 3. Then, side electrodes 35, 36 comprising baked silver are formed so that end portions of the internal electrodes 323, 324 so exposed become conductive.

Baked silver constituting the side electrodes 35, 36 is an electrode prepared by baking Ag paste, as will be described later, and is composed of Ag (97%) and a glass frit component (3%).

External electrodes (denoted by reference numeral 24 in FIG. 1) are bonded onto the side electrodes 35, 36 using a conductive adhesive. 18-8 stainless steel is used as the external electrode 24.

A resin silver used to bond the external electrode 24 is composed of 80% of Ag and 20% of epoxy resin.

Figure 2:
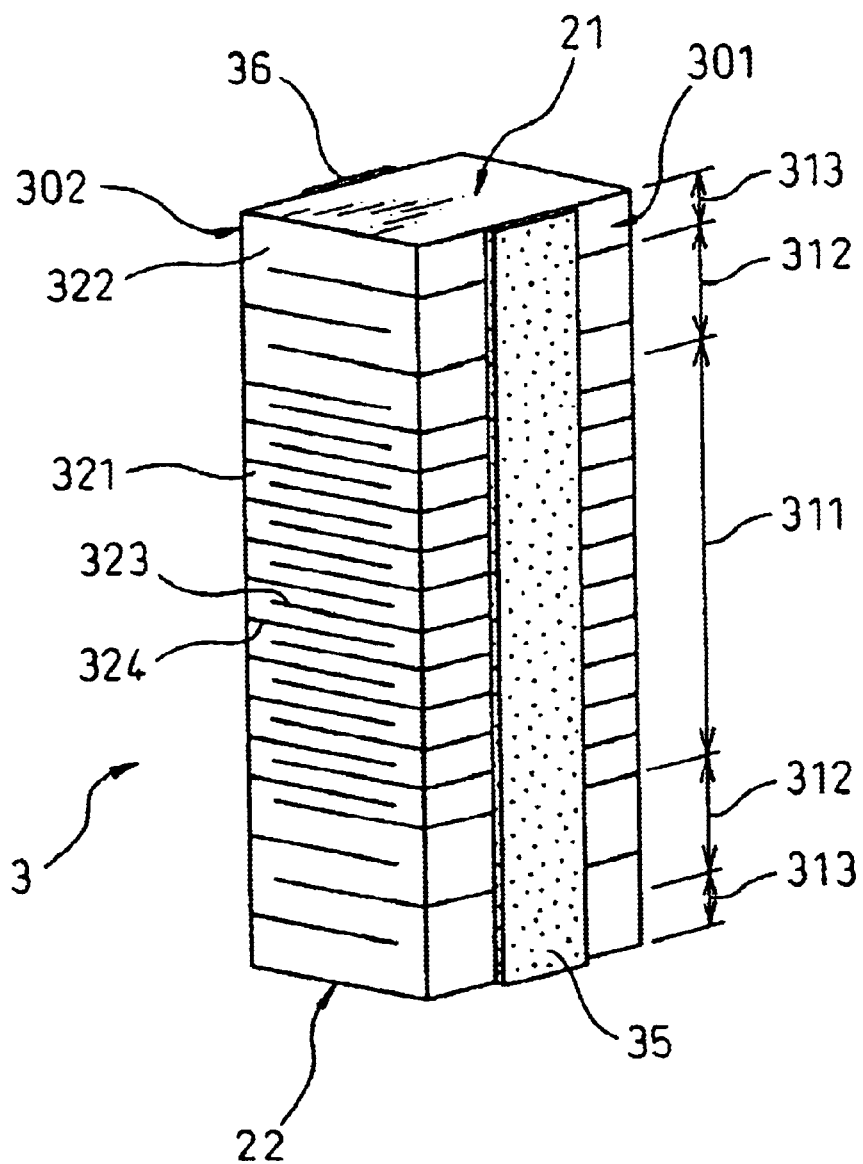
FIG. 2 is an explanatory view of the piezoelectric element according to the first embodiment shown in FIG. 1.
Figure 3A:
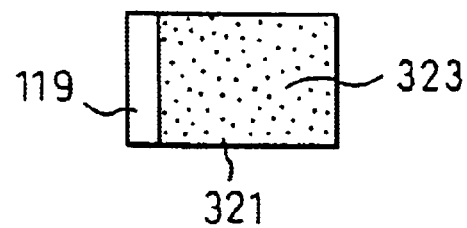
FIGS. 3A to 3c are exploded explanatory views of the piezoelectric element according to the first embodiment shown in FIG. 1.
Figure 3B:
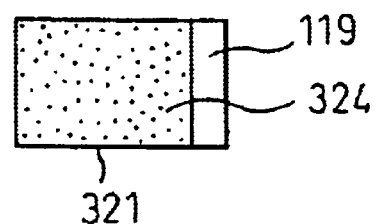
Figure 3C:
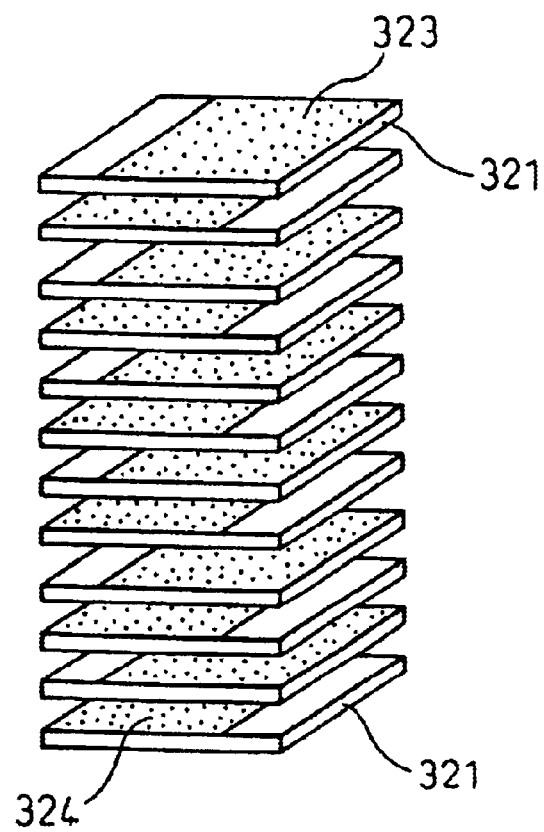

In addition, as is shown in FIG. 2, in the piezoelectric element, a central portion in the stacking direction is referred to as a driving portion 311, portions disposed so as to hold the driving portion are referred to as a buffer portion 312, and portions disposed so as to hold the buffer portions 312 are referred to as a dummy portion 313.

As is shown in FIG. 1, the piston member 11 comprises a proximal end portion 111 which has substantially the same cross-sectional configuration as piezoelectric element 3 and a shaft portion 112 having a smaller diameter (e.g., an outside diameter "a" of 6 mm). The piston member 11 is made of stainless steel, alumina or materials which are elastically deformable only a little. Then, bonded to the shaft portion 112 on an opposite side to the case main body 20 in the expandable direction of the expandable portion 201 is the disk-like distal-end plate portion 12 which has a larger outside diameter (e.g., of 10.2 mm).

In addition, a stainless steel pipe having a thickness of 0.3 mm and an outside diameter of 10.2 mm is prepared for the case main body 20 which covers the outside of the piezoelectric element 3.

Additionally, a bellows made of stainless steel and having a thickness of 0.17 mm is prepared as the expandable portion 201. As shown in FIG. 1, the expandable portion 201 is a cylindrical body having large-diameter portions 203 and small-diameter portions 204 in an alternate fashion.

The outside diameter of the large-diameter portion 203 is 9.5 mm and the inside diameter of the small-diameter portion 204 is 6.5 mm. Note that a rear-end portion 205 of the expandable portion 201 which is adapted to be bonded to the case main body 20 is provided as having substantially the same outside diameter as that of the case main body 20, whereas a distal-end face 206 of the expandable portion 201 which is adapted to be joined to the distal-end plate portion 12 is provided as having substantially the same outside diameter as that of the distal-end plate portion 12.

The case main body 20 and the rear-end portion 205 of the expandable portion 201 are joined to each other in a closed state so that a sealed state can be maintained. In addition, the distal-end face 206 of the expandable portion 201 and the distal-end plate portion 12 are also joined to each other in a closed state.

In addition, provided at an upper-end portion of the piezoelectric element 3 is the upper plate 23 adapted to seal an upper end of the case main body 20 and having a through hole 240 for guiding the external electrode 24 to the outside. The outside diameter of the upper plate 23 is the same as the inside diameter of the case main body 20. Additionally, the external electrode 24 is passed through the through hole 240 in the upper plate 23 and a seal member is filled therein so as to fill a gap formed between the through hole 240 and the external electrode 24.

Next, as shown in FIG. 1, a contact state in which the piston member 11 and the distal-end plate portion 12 are in contact with each other will be described below.

As shown in the same figure, the distal-end face 113 of the piston member 11 is formed into a hemispherical configuration.

In addition, provided in the receiving face 121 of the distal-end plate portion 12 is a conical depression having a triangular cross section. As shown in FIG. 1, both the distal-end face 113 and the depression are brought into annular and linear contact with each other.

The distal-end face 113 of the piston member 11 comprises a hemispherical convex surface and the diameter a of the convex surface is equal to the diameter of the shaft portion 112 which is 6 mm.

In addition, the major diameter b of the conical concave surface in the receiving face 121 is the major diameter of the opening in the concave surface which is 7 mm.

Additionally, an annular contact portion between the convex surface and the concave surface is a dotted line circle indicated by a reference character C in FIG. 1, whose diameter is 4.5 mm.

Figure 4:
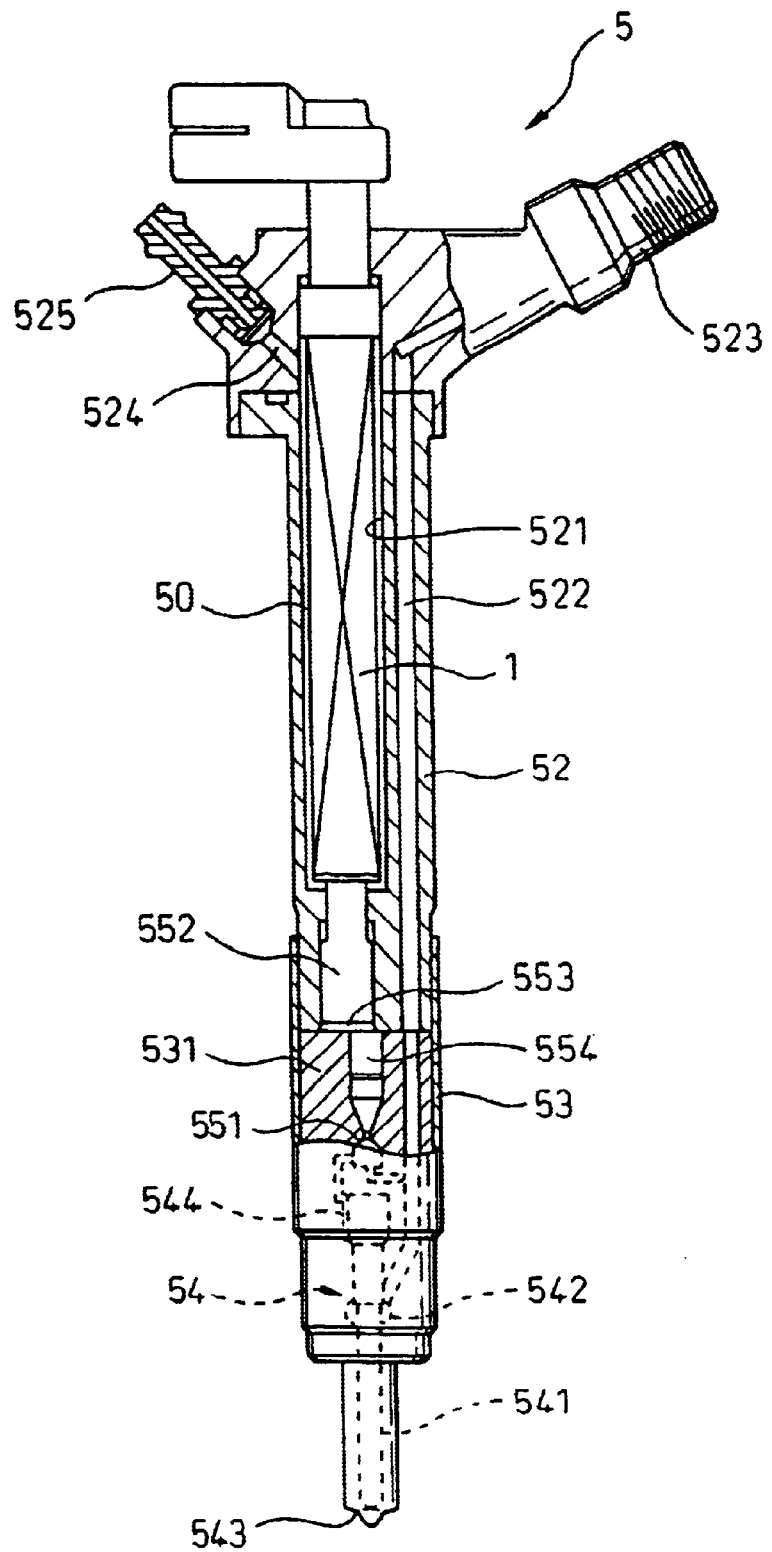
FIG. 4 is an explanatory view showing the construction of an injector which incorporates therein the piezoelectric element and the displacement transmitting construction according to the first embodiment shown in FIG. 1.

Furthermore, the piezoelectric element adopting therein the displacement transmitting construction according to this embodiment is used in an injector as shown in FIG. 4.

As shown in FIG. 4, an injector 5 is applied to a common rail injection system for a diesel engine.

As shown in the same figure, the injector 5 has an upper housing 52 in which a piezoelectric actuator 1 is accommodated as a driving portion and a lower housing 53 fixed to the upper housing 52 and having an injection nozzle portion 54 which is formed in the interior thereof.

The upper housing 52 is substantially cylindrical, and the piezoelectric actuator 1 is passed through and fixed in a vertical hole 521 which becomes eccentric to a central axis of the upper housing 52.

A highly pressurized fuel passage 522 is provided in parallel to a side of the vertical hole 521, and an upper-end portion thereof is allowed to communicate with an external common rail (not shown) via the interior of a fuel introducing pipe 523 which protrudes into an upper-side portion of the upper housing 52.

In addition, a fuel drain pipe 525 which communicates with a drain passage 524 is provided in such a manner as to protrude into the upper-side portion of the upper housing 52, and fuel flowing out of the fuel drain pipe 525 is returned to a fuel tank (not shown).

The drain passage 524 communicates with a three-way valve 551, which will be described later, by way of a passage which passes through a gap 50 between the vertical hole 521 and the driving portion (the piezoelectric actuator) 1 and further extends from the gap 50 downwardly through the upper and lower housings 52, 53.

The injection nozzle portion 54 comprises a nozzle needle 541 adapted to slide within a piston body 531 in a vertical direction and an injection hole 543 adapted to be opened and closed by the nozzle needle 541 for injecting into each cylinder of an engine highly pressurized fuel which is supplied from a fuel reservoir 542. The fuel reservoir 542 is provided around an intermediate portion of the nozzle needle 541, and a lower-end portion of the highly pressurized fuel passage 542 is made to open to the highly pressurized fuel passage 522. The nozzle needle 541 receives a fuel pressure from the fuel reservoir 542 in an valve opening direction and a fuel pressure in a valve closing direction from a backpressure chamber 544 provided so as to face an upper-end of the nozzle needle 541, whereby when the pressure in the backpressure chamber 544 is reduced the nozzle needle 541 is lifted up to thereby open the injection hole 543 for fuel injection.

The pressure in the backpressure chamber 544 is designed to be increased and decreased by the three-way valve 551. The three-way valve 551 is constructed to selectively communicate with the backpressure chamber 544 and the highly pressurized fuel passage 522 or the drain passage 524. Here, the three-way valve 551 has a ball-like valve element which opens and closes a port which communicates with the highly pressurized fuel passage 522 of the drain passage 524. This valve element is driven by the driving portion 1 via a large-diameter piston 552, a hydraulic chamber 553 and a small-diameter piston 554.

The function and effectiveness of the embodiment will be described below.

The piezoelectric element 3 according to the embodiment is in direct contact with the piston member 11 which constitutes the displacement transmitting construction 10. In addition, the distal-end plate portion 12 of the displacement transmitting construction 10 is brought into direct contact with the large-diameter piston 552 of the injector which constitutes a mating member.

Thus, according to the embodiment, Hertz stress generated at the contact portion where different members are brought into contact with each other, and a loss which occurs when a displacement is consumed by the deformed members, can be reduced. This is because the embodiment is constituted by the displacement transmitting construction 10 constituted by the two members and does not exist in association with the large-diameter piston 552 when it becomes a mating member of members other than the displacement transmitting construction 10.

In addition, in this embodiment, the piezoelectric element 3 is constructed so as to be substantially fixed relative to directions except for the displacement direction of the piezoelectric member by the upper plate 23, the case 20 and the displacement transmitting construction 10, and the both end faces 21, 22 of the piezoelectric element 3 in the displacement direction thereof are maintained substantially in parallel to each other.

Additionally, the piezoelectric element 3, the piston member 11, and the distal-end plate portion 12 are made to be stationary relative to directions except for the displacement direction of the piezoelectric element 3 or are maintained so as not to deviate in transverse directions.

Due to this, it is difficult for an unbalanced stress to be applied to the piezoelectric element 3, and a stress concentration on a specific portion of the piezoelectric element 3 becomes rare. Consequently, the piezoelectric element 3 can be prevented from being damaged.

Additionally, the contact configuration between the distal-end face 113 of the piston member 11 and the receiving face 121 of the distal-end plate portion 12 is in the annular and linear contact conditions.

Thus, when compared with the conventional case where curved surfaces come into point contact with each other, a more stable contact condition is provided. In addition, the Hertz stress can also be reduced.

Furthermore, since the contact configuration is linear, when compared with the case where members are brought into point contact with each other, the piston member 11 and the distal-end plate portion 12 tend to deform less, whereby the displacement of the piezoelectric element 3 can be transmitted to the large-diameter piston 552 (the mating member) of the injector while the loss is kept smaller.

Thus, according to the first embodiment, it is possible to provide a construction for transmitting the displacement of a piezoelectric element which can be disposed between the stacked piezoelectric element and the mating member to which the displacement of the former is transmitted without any extra member being interposed therebetween, which can minimize a loss associated with the transmission of the displacement of the former and which can make difficult the application of an unbalanced load to the stacked piezoelectric element. Furthermore, in the displacement transmitting construction 10 according to the embodiment, the major diameter of the hemispherical convex surface formed on the distal-end face 113 of the piston member 11 is 6 mm, whereas the major diameter of the conical concave surface is 7 mm. Thus, it is the major diameter of the hemispherical convex surface formed on the distal-end face 113 of the piston member 11 which is shorter. Consequently, the diameter of the annular contact configuration between the convex surface and the concave surface is 4.5 mm and, as the requirement is fulfilled that the major diameter of the annular contact configuration is to have a length which is 50% or longer and 90% or shorter than that of one of the major diameters of the hemispherical convex surface and the conical concave surface in the distal-end face and the receiving face which is shorter, the effectiveness of the annular and linear contact can be sufficiently obtained, and the loss in transmitting the displacement of the piezoelectric element can be reduced to thereby increase the efficiency of the transmission.

Second Embodiment

Figure 5:
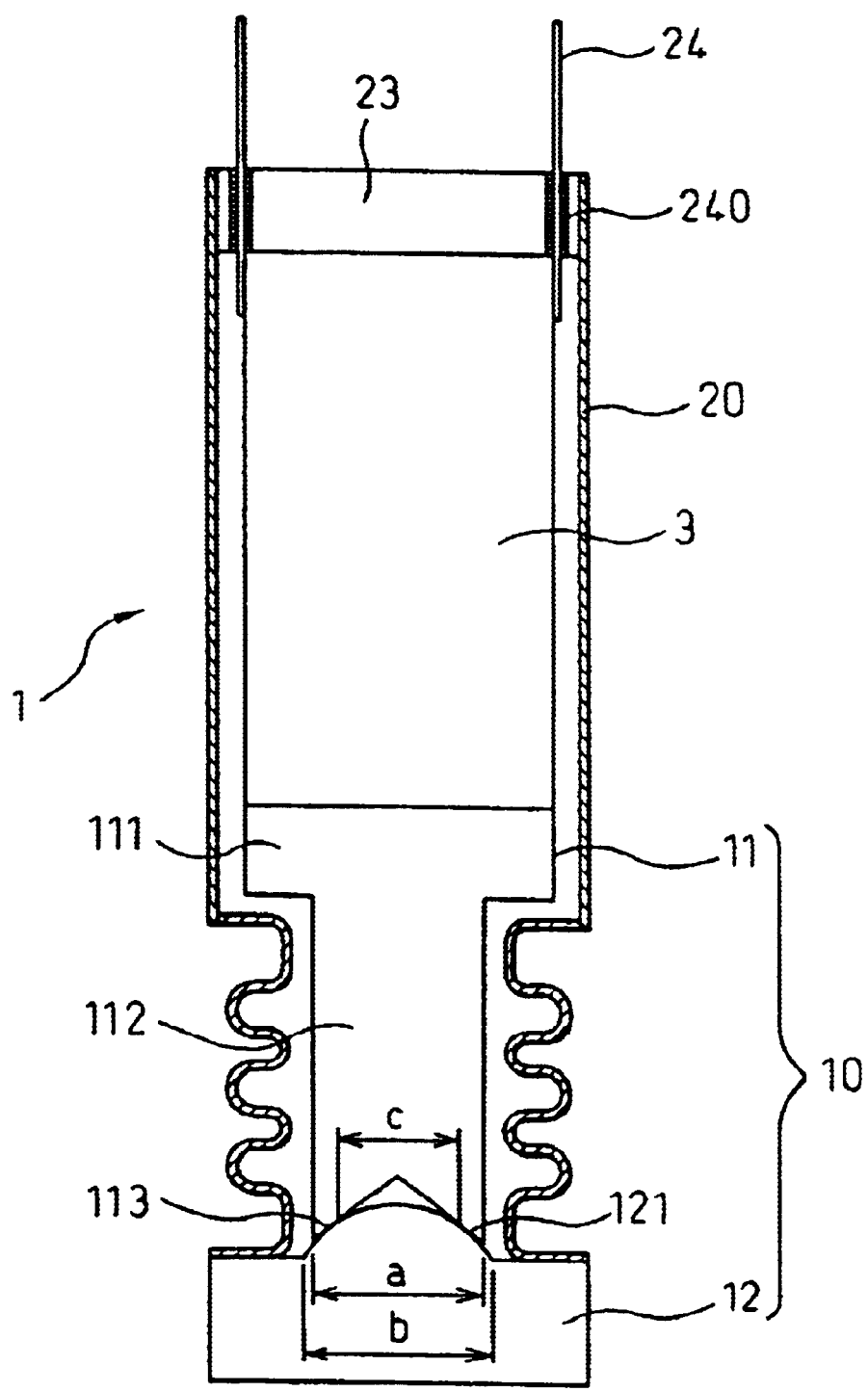
FIG. 5 is a sectional explanatory view showing a piezoelectric element and a displacement transmitting construction according to a second embodiment of the invention.

Conversely to the first embodiment, in a displacement transmitting construction 10 according to a second embodiment shown in FIG. 5, a conical depression having a triangular cross section is formed in a piston member 11. A receiving face 121 of a distal-end plate portion 12 is of a hemisphere.

Similarly to the first embodiment shown in FIG. 1, the contact condition between the two members is annular.

The remaining portions remain the same as those described in the first embodiment, and the function and effectiveness of the second embodiment are identical to those of the first embodiment.

Note that reference characters a, b, and c shown in the figure denote diameters of the conical concave surface formed in the piston member 11, of the hemispherical convex surface formed on the distal-end plate portion 12 and of the annular contact configuration between the piston member 11 and the distal-end plate portion 12.

Third Embodiment

Figure 6:
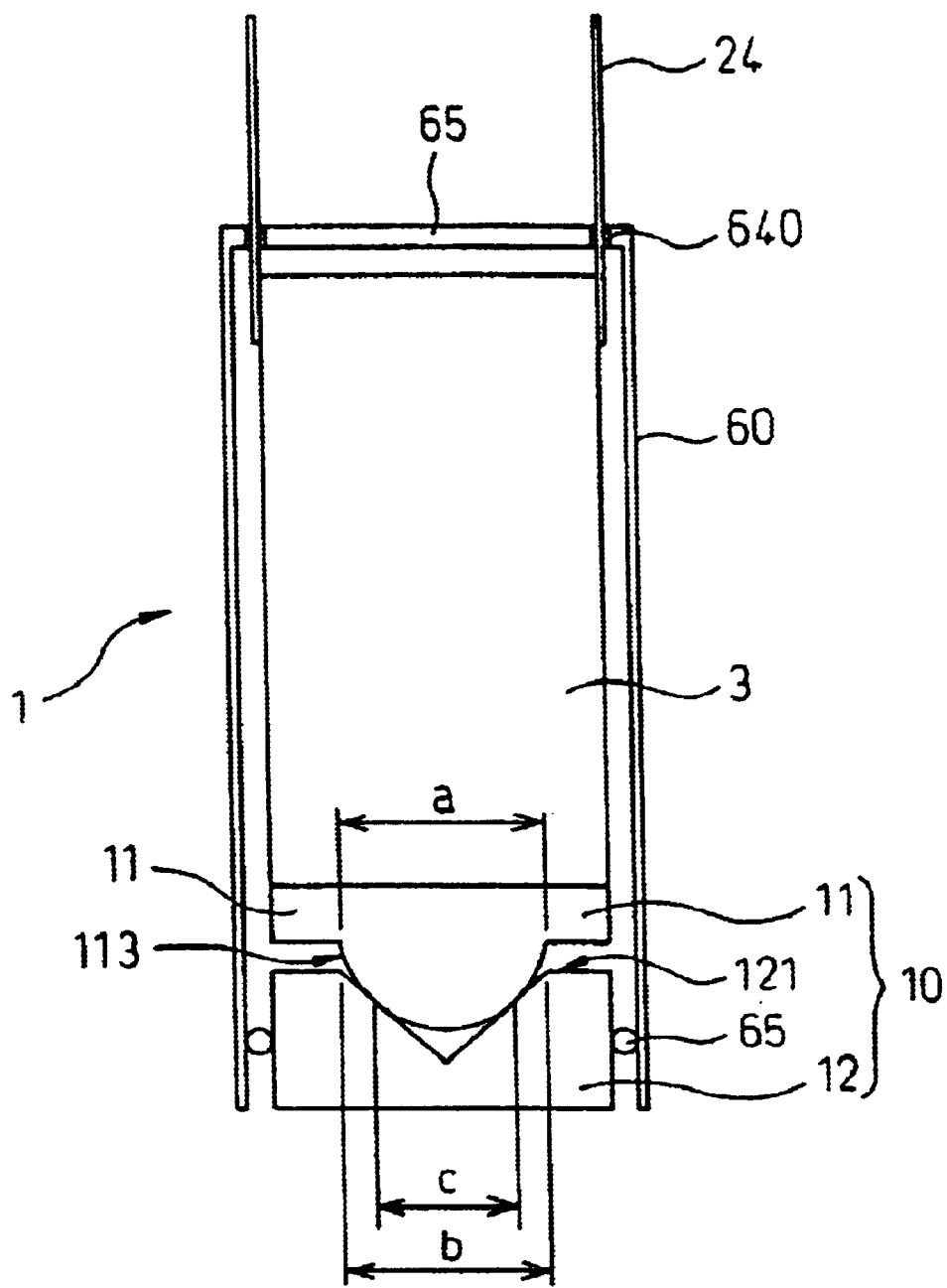
FIG. 6 is a sectional explanatory view showing a piezoelectric element and a displacement transmitting construction according to a third embodiment of the invention.

As shown in FIG. 6, according to the construction of a third embodiment, a shaft portion is not provided on a piston member 11 of a displacement transmitting construction 10, and a case 60 is made to extend as far as the side of a distal-end plate portion 12.

In addition, an O-ring 65 is provided on the side of the distal-end plate portion 12, and an inside of the case is sealed so as to be maintained in a sealed state.

Furthermore, a through hole 640 is formed in an end face 65 of the case 60 in the displacement direction of the piezoelectric element, so that the external electrode 24 is drawn through the hole 640 to the outside.

The remaining portions of the third embodiment are identical to those of the first embodiment, and the function and effectiveness thereof are identical to those of the first embodiment.

Note that reference characters a, b, and c shown in the figure denote diameters of the hemispherical convex surface formed on the piston member 11, of the conical concave surface formed in the distal-end plate portion 12 and of the annular contact configuration between the piston member 11 and the distal-end plate portion 12.

Fourth Embodiment

Figure 7:
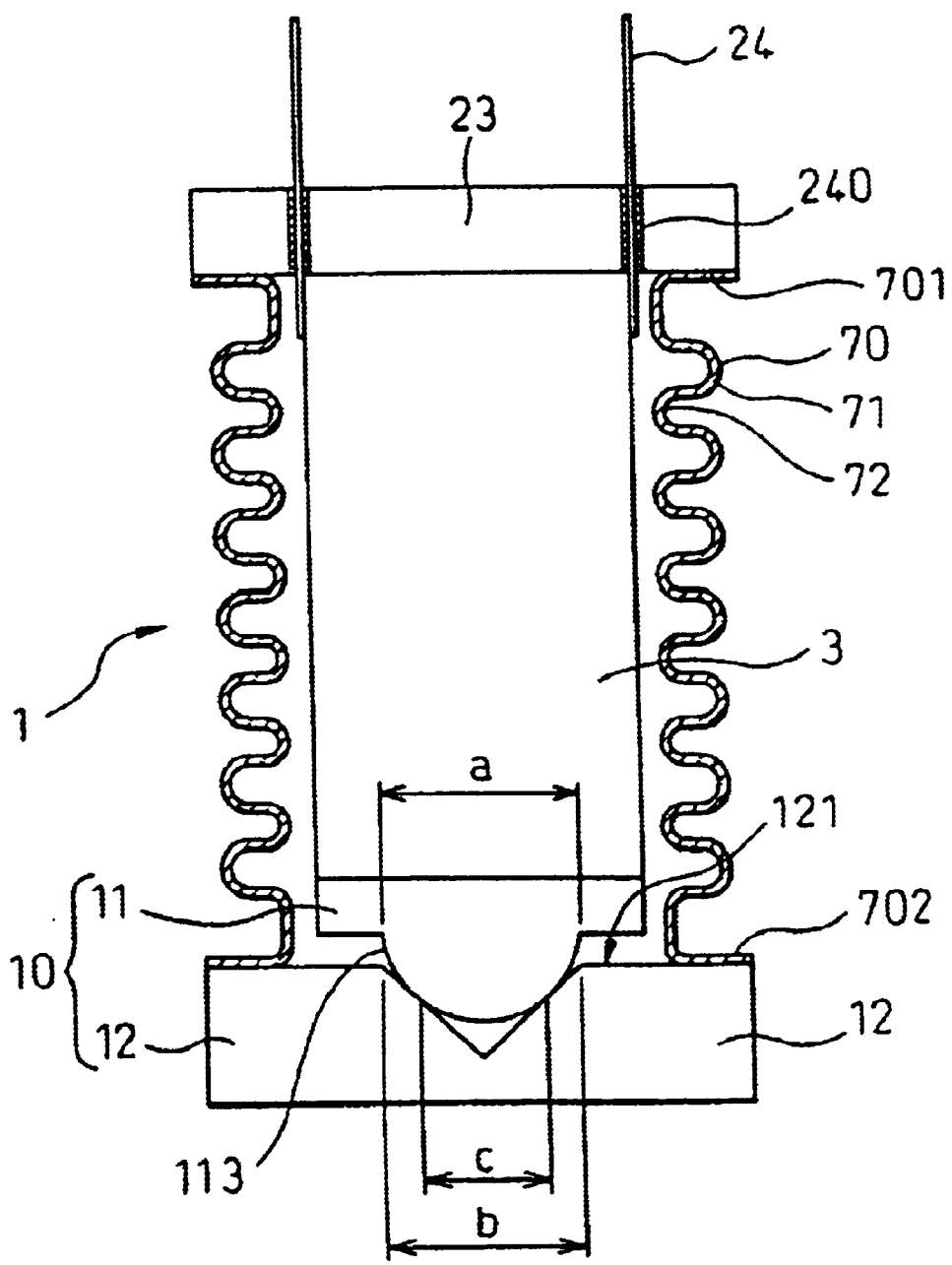
FIG. 7 is a sectional explanatory view showing a piezoelectric element and a displacement transmitting construction according to a fourth embodiment of the invention.

As shown in FIG. 7, according to the construction of a fourth embodiment, a shaft portion is not provided on a piston member 11 of a displacement transmitting construction 10, and a cylindrical case 70 is provided between an upper plate 23 and a distal-end plate portion 12.

The case 70 is generally expandable and is a cylindrical body having a irregular cross-sectional configuration in which large-diameter portions 71 and small-diameter portions 72 are arranged in an alternate fashion. An end portion 701 that is joined to an upper plate 23 is formed to have substantially the same outside diameter as the outside diameter of the upper plate 23 whereas an end portion 702 that is joined to the distal-end plate portion 12 is formed to have substantially the same outside diameter as the outside diameter of the distal-end plate portion 12.

The remaining portions of the fourth embodiment are identical to those of the first embodiment, and the function and effectiveness thereof are identical to those of the first embodiment.

Note that reference characters a, b, and c shown in the figure denote diameters of the hemispherical convex surface formed on the piston member 11, of the conical concave surface formed in the distal-end plate portion 12 and of the annular contact configuration between the piston member 11 and the distal-end plate portion 12.

Fifth Embodiment

Figure 8:
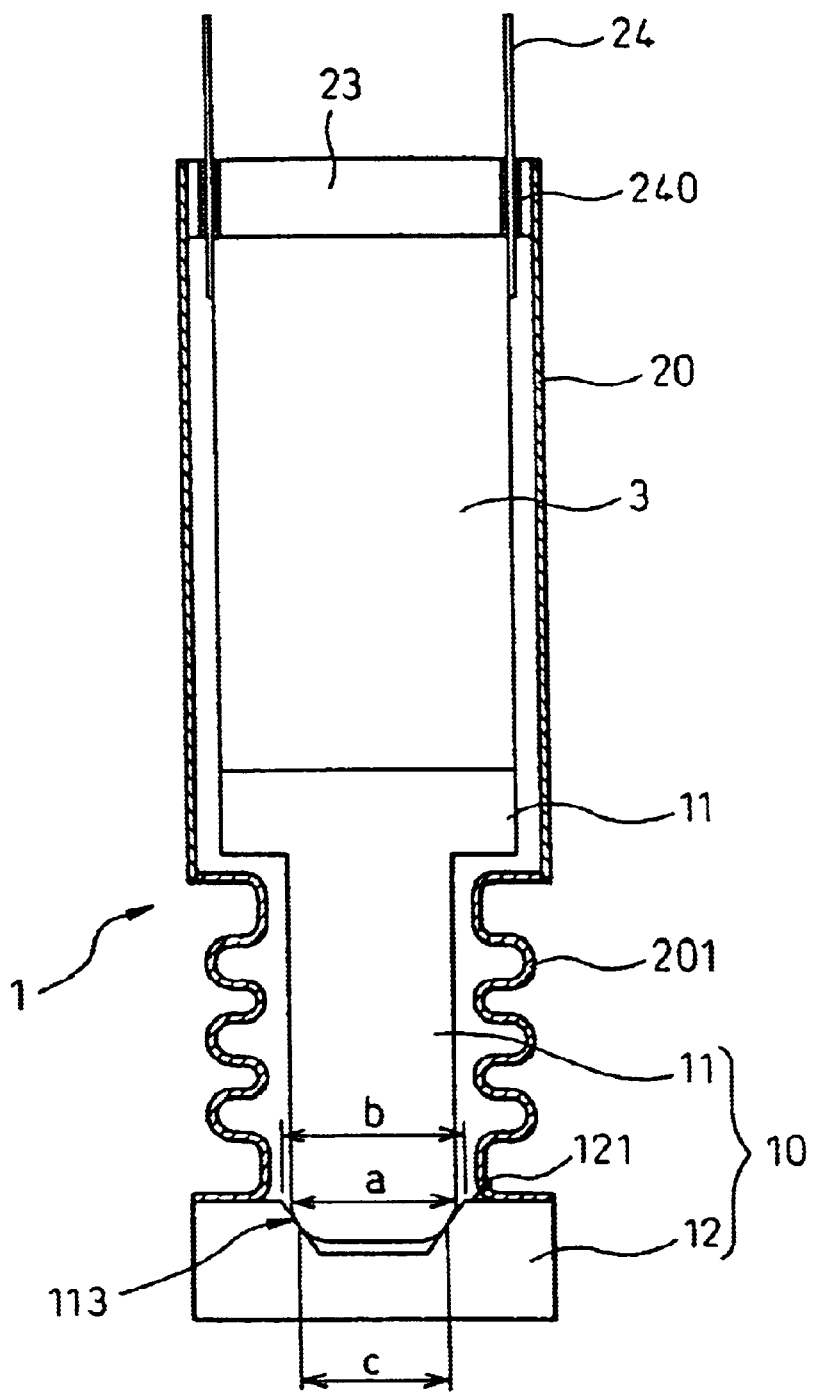
FIG. 8 is a sectional explanatory view showing a piezoelectric element and a displacement transmitting construction according to a fifth embodiment of the invention.

As is shown in FIG. 8, according to the construction of a fifth embodiment, while there are provided a case 20, a piston member 11 which is a displacement transmitting member and a distal-end plate portion which are constructed substantially in the same way as that in which the corresponding members of the first embodiment are constructed, the configurations of a hemispherical convex surface formed on a distal-end face 113 of the piston member 11 and a conical concave surface formed in a receiving face 121 of the distal-end plate portion 12 are different.

The distal-end of the piston member 11 including the distal-end face 113 according to the embodiment is formed generally into the configuration of a circular post which is chamfered. In addition, the concave surface in the receiving face 121 is formed into a conically trapezoidal shape which is substantially the same as the concave surface of the first embodiment except that the bottom portion thereof is constructed to be a flat plane.

The remaining portions of the fifth embodiment are identical to those of the first embodiment, and the function and effectiveness thereof are identical to those of the first embodiment.

Note that reference characters a, b, and c shown in the figure denote diameters of the convex surface formed on the piston member 11, of the concave surface formed in the distal-end plate portion 12 and of the annular contact configuration between the piston member 11 and the distal-end plate portion 12.

Sixth Embodiment

Figure 9A:
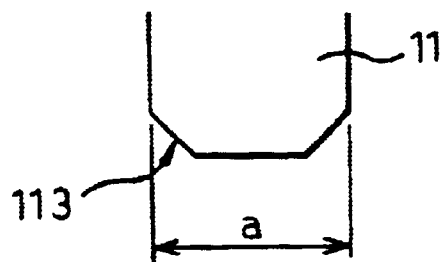
FIG. 9A is an explanatory view showing a distal-end face of a piston member according to a sixth embodiment of the invention.

In addition, as the configuration of the distal-end face 113 of the piston member 11 which is different from those described for the first to fifth embodiments, as shown in FIG. 9A, a configuration can be proposed in which the cross-sectional configuration of the distal-end face becomes a trapezoidal configuration.

Figure 9B:
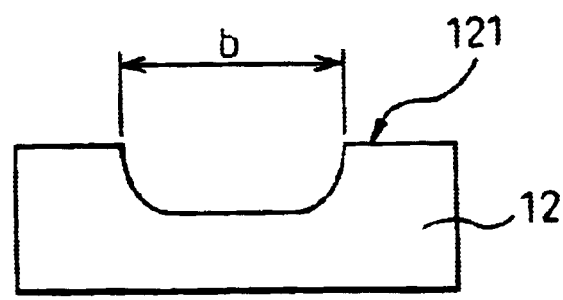
FIGS. 9B and 9C are explanatory views showing distal-end plate portions according to the sixth embodiment of the invention.
Figure 9C:
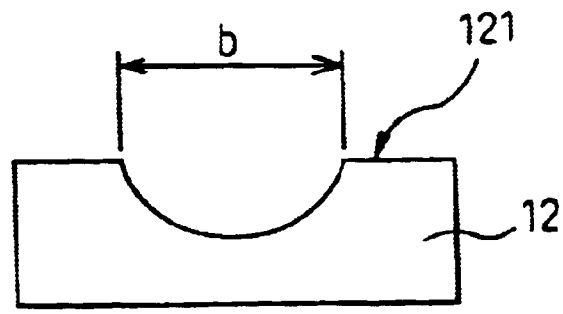

FIG. 9B shows a conically trapezoidal configuration having a curved surface for the concave surface formed in the receiving surface 121 of the distal-end plate portion 12. FIG. 9C shows a hemispherical configuration for the concave surface of the receiving face 121.

With any of these configurations, these contact configurations are annular and the same effectiveness as that provided by the first embodiment can be obtained. Further, with any combination of these configurations as mentioned above, the contact configuration between the distal-end face 113 of the piston member 11 and the receiving surface 121 of the distal-end plate portion 12 is annular, and the same effectiveness can be obtained.

As has been described heretofore, according to the invention, a piezoelectric element in which internal electrode layers are interposed between ceramic piezoelectric layers in such a manner that positive and negative poles are formed alternately can be used as the laminated piezoelectric element. In this case, one of the internal electrode layers is disposed in such a manner as to be exposed to one side and the other internal electrode layer is disposed in such a manner as to be exposed to the other side of the piezoelectric element.

When energized, voltage is applied to the piezoelectric layers from the internal electrode, then the piezoelectric layers are displaced, and the piezoelectric element is driven. This displacement becomes the displacement of the piezoelectric element. In addition, the laminated piezoelectric layers are laminated in a direction in which the piezoelectric layers are displaced.

The configuration of the piezoelectric layers constituting the piezoelectric element can be selected optionally from a substantially tetragonal shape, a polygonal shape, a barrel-like shape and the like.

In addition, while any material can be freely selected for use for the piezoelectric layers as long as the material has a piezoelectric effect, PZT (lead titanate and zirconate) was used in the aforesaid embodiments.

Additionally, the end faces of the piezoelectric element in the displacement direction thereof are maintained substantially parallel.

As this occurs, it is most desirable that the one end face and the other end face of the piezoelectric element are in parallel to each other, but the effectiveness of the invention can be obtained even if they slightly deviate from each other.

It is desirable that the angle of deviation ranges within two degrees. With an angle larger than two degrees, there is caused a risk that the piezoelectric element is damaged due to an unbalanced load.

Furthermore, as with the aforesaid first embodiment, in the event that the piezoelectric element is sandwiched between the upper plate and the piston member, the end faces of the piezoelectric element in the displacement direction thereof can be made parallel by making parallel end faces of the upper plate and the piston member which confront the piezoelectric element, respectively.

Alternatively, the end faces of the piezoelectric element can be made parallel by adopting as the piezoelectric element for use a piezoelectric element whose end faces in the displacement direction thereof are parallel or piezoelectric layers constituting the piezoelectric element which are higher in degree of parallelism.

Figure 1A:
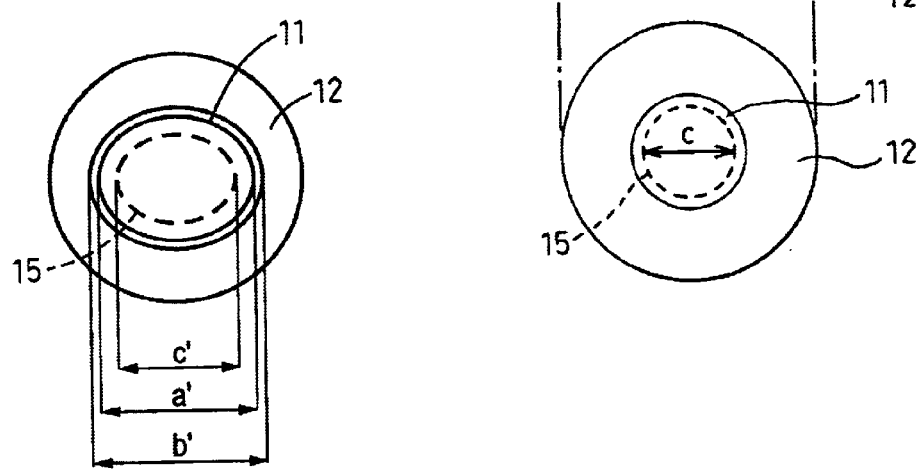
FIG. 1A shows a plan view similar to that of FIG. 1 for the case where the annular contact configuration is of oval shape.

The contact configuration between the distal-end face of the piston member and the receiving face of the distal-end plate portion is an annular and linear contact condition. In this case, "annular" means substantially a closed curve such as a circle or an oval (as depicted in FIG. 1A).

In the annular and linear contact condition, it is desirable that the center of the annulus coincides with central axes of the piezoelectric element, the piston member and the distal-end plate portion.

This helps prevent the piezoelectric element from being damaged by an unbalanced load.

As the contact configuration between the distal-end face of the piston member and the receiving face of the distal-end plate portion is annular and symmetrical, a deviation in a direction normal to the displacement direction or a transverse deviation is rare. In addition, with the annular and symmetrical contact, as the piston member is difficult to deform when compared with a point contact, the loss in displacement will also be reduced.

In addition, the piezoelectric element, the piston member and the distal-end plate portion are constructed so as to remain substantially stationary relative to directions except for the displacement direction of the piezoelectric element.

In this case, the term "substantially stationary" means that there occurs little change in the relative position between the piezoelectric element and the displacement transmitting construction.

In order for the relative position between the piezoelectric element and the displacement transmitting construction not to be changed relative to directions other than the displacement direction of the piezoelectric element when the same element is being driven, it can be attained by suitably disposing a casing, a supporting member or the like, outward of the displacement transmitting construction or the piezoelectric element, which can restrict the movement thereof.

Alternatively, the piezoelectric element and the displacement transmitting construction can be formed into an axially symmetrical configuration so that the both members can be disposed coaxially, whereby the piezoelectric element and the displacement transmitting construction can naturally be made stationary relative to directions other than the displacement direction.

According to a construction such as the one described in the first embodiment, movements in directions other than the displacement direction can be suppressed to some extent by means of the case or the like, and moreover, the piston member and the piezoelectric element are located in the positional relationship in which the central axes passing through the centers of gravity of the piezoelectric element and the piezoelectric element coincide with each other and, in a free state, they are constructed to be so balanced that they do not move in any other directions than the central axis direction or the displacement direction of the piezoelectric element.

With the displacement transmitting construction according to the invention, preferably, the piston member and the distal-end plate portion are disposed coaxially with the central axis of the piezoelectric element and the relative positional relationship therebetween does not move in any direction other than the displacement directions while the piezoelectric element is being driven, whereby an unbalanced load is rarely generated, thereby making it possible to prevent the piezoelectric element from being damaged.

In addition, the distal-end face of the piston member is formed into the hemispherical convex surface, and the receiving face of the distal-end plate portion is formed into the conical concave surface.

Additionally, preferably, the receiving face of the distal-end plate portion is formed into the hemispherical convex surface, whereas the distal-end surface of the piston member is formed into the conical concave shape.

In this case, as the hemispherical convex surface and the conical concave surface are constructed so as to be brought into contact with each other, the contact condition therebetween becomes the annular and linear contact condition.

As they contact each other linearly, when compared with the point contact between curved components, the piston member and the distal-end plate portion are allowed to be brought into stable contact with each other, and Hertz stress can also be minimized. Moreover, the piston member and the distal-end place portion deform less, and the displacement of the piezoelectric element can be transmitted to the mating member with a minimized loss. In addition, since they contact each other in the annular fashion, unbalanced stress is difficult to apply, and stress is rarely concentrated on a specific portion of the piezoelectric element, thereby making it possible to prevent the piezoelectric element from being damaged.

In addition, proposed as the specific configuration for the conical concave surface, are the conical depression having an inverted triangular cross section or the conically trapezoidal configuration having the trapezoidal-conical cross section with the bottom portion being formed into the flat plane. Also, a depression may be proposed in which the sides of the triangular or trapezoidal cross section are curved.

Furthermore, specifically proposed as the hemispherical convex surface is a semicircular convex portion.

Note that the term "hemispherical" denotes a configuration constructed by cutting the sphere in parallel to a circle which is a cross section including the center of the sphere, and it does not always mean a half of the sphere.

Moreover, the contact configuration between the distal-end face of the piston member and the receiving face of the distal-end plate portion is annular including oval (see FIG. 1A, and the major diameter of the annular contact configuration is desirably 50% or longer than the length of one of the major diameters of the convex surface on the distal-end face and the concave surface in the receiving face which is shorter.

As this occurs, Hertz stress can be minimized, and the effect of the linear contact can be sufficiently obtained, whereby the transmission loss can also be minimized.

In the event that the major diameter is less than 50%, there may a risk that the effect of the linear contact cannot be sufficiently obtained whereby the transmission loss cannot be minimized.

In addition, the diameter of the hemispherical convex surface on the piston member becomes the major diameter of the surface of the hemispherical convex surface which is brought into abutment with the receiving face in the distal-end plate portion or the spherical surface.

The major diameter of the conical convex surface becomes the major diameter of the opening formed in the distal-end plate portion.

Moreover, the contact configuration between the distal-end face of the piston member and the receiving face of the distal-end plate portion is annular including oval (see FIG. 1A), and the major diameter of the annular contact configuration is desirably 90% or shorter than the length of one of the major diameters of the convex surface on the distal-end face and the concave surface in the receiving face which is shorter.

As this occurs, even in the event that there occurs a deviation in degree of parallelism between the piston member and the distal-end plate portion, a sufficient linear contact (along the full circumference) can be provided.

In the event that the major diameter is larger than 90%, if there occurs a deviation in degree of parallelism, there may caused a risk that there are generated some portions where the linear contact condition is insufficient or no contact is possible. Moreover, as a result, there may be caused a risk that an excessive force is applied and the relevant portions deform, an unbalanced load being thereby applied.

The displacement transmitting face of the distal-end plate portion is preferably a flat plane.

Even in the event that the distal-end plate portion deviates in position in a transverse direction that is normal to the displacement axial direction, since there exist no irregularities on the displacement transmitting face, a bending force is in no case forcibly applied to the stacked piezoelectric element.

While a case or the like is commonly provided around the outer circumference of the piezoelectric element (refer to the first embodiment), the case can also be prevented from being subject to the bending force.

In the event that a bending force is applied to the case, the case deforms and contacts the piezoelectric element received in the case, whereby stress is applied to the piezoelectric element and the piezoelectric element wears, thereby causing a risk that the piezoelectric element is damaged. However, according to the construction of the invention, such a problem can be prevented.

Additionally, the mating member is preferably a driving device for the injector.

The injectors (fuel injection device) for an automotive internal combustion engine are constructed, for example, so as to move the valve element of a three-way or two-way valve connected to a common rail in which highly pressurized fuel is stored so that the valve is switched to be opened or closed in order to change the pressure condition exerted on the nozzle needle to open it for injecting fuel.

Consequently, the fuel injectors can be controlled finely to control in turn the fuel injecting condition in a precise fashion by using the piezoelectric element of the invention which has good response as a driving source.

While the invention has been described by reference to specific embodiments chosen for purposes of illustration, it should be apparent that numerous modifications could be made thereto by those skilled in the art without departing from the basic concept and scope of the invention.

What is claimed is:

1. A structure for transmitting the displacement of a piezoelectric element which is constructed in such a manner as to transmit to a mating member a displacement generated in a stacked piezoelectric element when said stacked piezoelectric element is energized to be driven, said structure for transmitting the displacement of a piezoelectric element comprising:

a piston member which is in direct contact with said piezoelectric element and is disposed at one end face of said piezoelectric element in a displacement direction thereof, and a distal-end plate portion which has a receiving face in direct contact with a distal-end face of said piston member in the displacement direction of said piezoelectric element and which is adapted to be brought into direct contact with a mating member to be driven at a displacement transmitting face thereof which is situated on an opposite side to said receiving face;

wherein both end faces of said piezoelectric element in the displacement direction thereof are maintained substantially in parallel with each other;

wherein an in-line annular contact configuration exists between said distal-end face of said piston member and said receiving face of said distal-end plate portion; and wherein said piezoelectric element, said piston member and said distal-end plate portion are constructed to include only one annular contact interface and to be substantially stationary relative to directions except for the displacement direction of said piezoelectric element.

2. A structure for transmitting the displacement of a piezoelectric element as set forth in claim 1, wherein:

one of said distal-end face of said piston member and said receiving face of said distal-end plate portion comprises a conical concave surface; and the other one of said receiving face of said distal-end plate portion and said distal-end face of said piston member comprises a hemispherical convex surface.

3. A structure for transmitting the displacement of a piezoelectric element as set forth in claim 2, wherein the contact configuration between said distal-end face of said piston member and said receiving face of said distal-end plate portion is an annular oval, and wherein a major diameter of said annular contact configuration has a length which is at least 50% longer than that of one of major diameters of said hemispherical convex surface and said conical concave surface in said distal-end face and said receiving face.

4. A structure for transmitting the displacement of a piezoelectric element as set forth in claim 2, wherein the contact configuration between said distal-end face of said piston member and said receiving face of said distal-end plate portion is an annular oval, and wherein a major diameter of said annular contact configuration has a length which is no more than 90% of one of major diameters of said hemispherical convex surface and said conical concave surface in said distal-end face and said receiving face.

5. A structure for transmitting the displacement of a piezoelectric element as set forth in claim 3, wherein the contact configuration between said distal-end face of said piston member and said receiving face of said distal-end plate portion is an annular oval, and wherein a major diameter of said annular contact configuration has a length which is no more than 90% of one of major diameters of said hemispherical convex surface and said conical concave surface in said distal-end face and said receiving face.

6. A structure for transmitting the displacement of a piezoelectric element as set forth in claim 1, wherein said displacement transmitting face of said distal-end plate portion comprises a flat plane.

7. A structure for transmitting the displacement of a piezoelectric element as set forth in claim 1, in combination with a fuel injector providing said mating member to be driven.

* * * * *